United States Patent
Yin et al.

(10) Patent No.: US 8,507,958 B2
(45) Date of Patent: Aug. 13, 2013

(54) TRANSISTOR AND METHOD FOR FORMING THE SAME

(75) Inventors: Haizhou Yin, Poughkeepsie, NY (US); Huilong Zhu, Poughkeepsie, NY (US); Zhijong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/112,993

(22) Filed: May 20, 2011

(65) Prior Publication Data

US 2012/0104474 A1    May 3, 2012

Related U.S. Application Data

(63) Continuation of application No. PCT/CN2011/000263, filed on Feb. 21, 2011.

(30) Foreign Application Priority Data

Oct. 29, 2010   (CN) .......................... 2010 1 0532050

(51) Int. Cl.
*H01L 29/772*   (2006.01)
(52) U.S. Cl.
USPC ................... 257/288; 257/391; 257/E29.255; 257/E21.249; 257/E21.409
(58) Field of Classification Search
USPC ................. 257/288, 327, E29.255, E21.249, 257/E21.409; 438/293, 301
See application file for complete search history.

(56) References Cited

U.S. PATENT DOCUMENTS

| | | | |
|---|---|---|---|
| 4,998,150 A * | 3/1991 | Rodder et al. | 257/288 |
| 6,800,887 B1 | 10/2004 | Weber et al. | 257/285 |
| 7,566,605 B2 * | 7/2009 | Shifren et al. | 438/199 |
| 2003/0234439 A1 * | 12/2003 | Currie et al. | 257/616 |
| 2004/0115916 A1 * | 6/2004 | Lochtefeld et al. | 438/597 |
| 2004/0166624 A1 | 8/2004 | Dokumaci et al. | 438/231 |
| 2005/0017309 A1 * | 1/2005 | Weber et al. | 257/376 |
| 2005/0148134 A1 * | 7/2005 | Dokumaci et al. | 438/199 |
| 2006/0081930 A1 * | 4/2006 | Maegawa et al. | 257/347 |
| 2006/0148215 A1 * | 7/2006 | Zhu et al. | 438/482 |
| 2006/0163651 A1 | 7/2006 | Rotondaro et al. | 257/336 |
| 2007/0231983 A1 * | 10/2007 | Shifren et al. | 438/197 |
| 2010/0038685 A1 | 2/2010 | Weber et al. | 257/288 |
| 2012/0104473 A1 * | 5/2012 | Yin et al. | 257/288 |
| 2012/0104486 A1 * | 5/2012 | Yin et al. | 257/327 |

FOREIGN PATENT DOCUMENTS

| | | |
|---|---|---|
| CN | 1175321 A | 3/1998 |
| CN | 101147252 A | 3/2008 |
| WO | WO 96/20499 | 7/1996 |

* cited by examiner

*Primary Examiner* — Thinh T Nguyen
(74) *Attorney, Agent, or Firm* — Martine Penilla Group, LLP (57) ABSTRACT

The present invention relates to a transistor and the method for forming the same. The transistor of the present invention comprises a semiconductor substrate; a gate dielectric layer formed on the semiconductor substrate; a gate formed on the gate dielectric layer; a source region and a drain region located in the semiconductor substrate and on respective sides of the gate, wherein at least one of the source region and the drain region comprises at least one dislocation; an epitaxial semiconductor layer containing silicon located on the source region and the drain region; and a metal silicide layer on the epitaxial semiconductor layer.

7 Claims, 10 Drawing Sheets

TRANSISTOR AND METHOD FOR FORMING THE SAME

CLAIM OF PRIORITY

This application claims priority under 35 U.S.C. §§120 and 365(c) as a continuation application of prior International Application No. PCT/CN2011/000263, filed Feb. 21, 2011, and which was not published in English under PCT Article 21(2). The PCT/CN2011/000263 application in turn claims priority to Chinese Application No. CN 201010532050.6, filed on Oct. 29, 2010. The disclosures of the prior international application and Chinese application are incorporated herein by reference.

FIELD OF THE INVENTION

The present invention relates to the field of semiconductor device manufacturing, and particularly, to a transistor and a method for forming the same.

BACKGROUND OF THE INVENTION

Typically, integrated circuits comprise a combination of N-type Metal Oxide Semiconductor (NMOS) and P-type Metal Oxide Semiconductor (PMOS) transistors formed on a substrate. The performance of an integrated circuit is directly related to the performance of transistors which it comprises. Therefore, it is desirable to improve the driving current of a transistor so as to enhance the performance thereof.

Figure 11A:
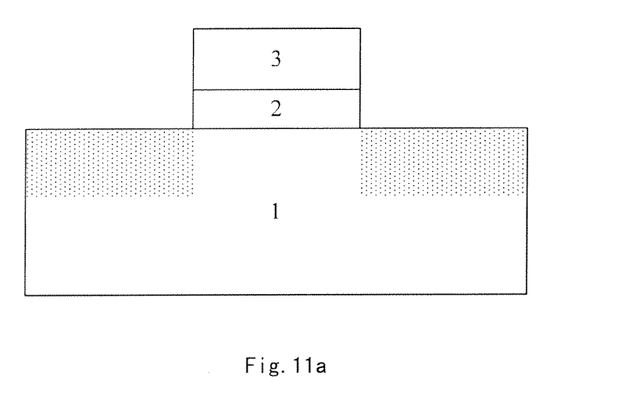
FIGS. 11a-11c illustrate the formation of dislocations in the prior art.
Figure 11B:
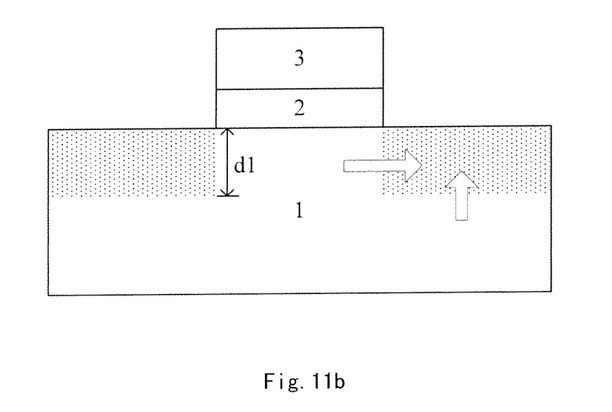
Figure 11C:
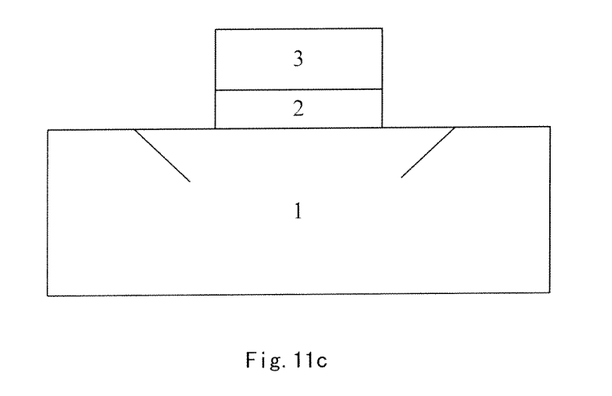

US patent application No. 2010/0038685A1 discloses a transistor in which dislocations are formed between the channel region and the source/drain region. The dislocations may cause tensile stress, which may improve the electron mobility in the channel and thus increase the driving current in the transistor. FIGS. 11a-c in the present application show the formation of such dislocations. In FIG. 11a, silicon is implanted into a semiconductor substrate 1 on which a gate dielectric 2 and a gate 3 have been formed so as to form amorphous regions as indicated by the shaded portions in the figure. Then the semiconductor substrate 1 is annealed so as to re-crystallize the amorphous regions. As indicated by the arrows in FIG. 11b, the crystal growth front in the horizontal direction and the crystal growth front in the vertical direction meet during the process of the re-crystallization. As a result, dislocations are formed as shown in FIG. 11c.

SUMMARY OF THE INVENTION

When free surface is at or below the level of channel, the tensile stress induced by dislocations will be significantly reduced. Generally, a metal silicide is formed on the source region and the drain region in order to reduce the contact resistance of the source and drain contacts. However, the formation of the silicide involves silicon and metal movements, which is equivalent to creating sort of free surface at the bottom of the silicide. Such free surface at the level of the channel will decrease the tensile stress induced by dislocations.

An object of the present invention is to provide a transistor and a method for forming the same.

The transistor according to the present invention comprises
a semiconductor substrate;
a gate dielectric layer formed on the semiconductor substrate;
a gate formed on the gate dielectric layer;
a source region and a drain region located in the semiconductor substrate and on respective sides of the gate, wherein at least one of the source region and the drain region comprises at least one dislocation;
an epitaxial semiconductor layer containing silicon located on the source region and the drain region; and
a metal silicide layer on the epitaxial semiconductor layer.

The method for forming a transistor according to the present invention comprises
forming a mask layer on a semiconductor substrate on which a gate has been formed so that the mask layer covers the gate and the semiconductor substrate;
patterning the mask layer so that at least a portion of at least one of a source region and a drain region is exposed;
performing a first ion implantation in the exposed portion of the source region and/or the drain region; and
annealing the semiconductor substrate so as to form a dislocation in the exposed portion of the source region and/or the drain region;
forming a semiconductor layer containing silicon on the source and drain regions; and
forming a metal layer on the semiconductor layer and performing annealing so as to form a metal silicide,
wherein the bottom of the metal silicide is higher than the channel between the source region and the drain region.

In the transistor of the present invention, a silicon-containing semiconductor layer is formed on the source region and the drain region, and a metal is deposited on the semiconductor layer so as to form the metal silicide of which the bottom is above the channel. According to present invention, contact resistance of the source and drain contacts is reduced through forming the metal silicide while the tensile stress created by the dislocations formed in the source region and/or the drain region is prevented from significantly decreasing due to the fact that the bottom of the metal silicide is above the channel.

Other aspects and advantages of the present invention will be detailed hereinafter in combination with the accompanying drawings.

DETAILED DESCRIPTION OF THE PREFERRED EMBODIMENTS

The preferred embodiments of the present invention will be detailed in the following in combination with the accompanying drawings. The drawings are drawn schematically and not to scale for the purpose of illustrating the embodiments of the present invention rather than limiting the protection scope thereof. The same reference numbers are used to indicate same or similar components throughout the drawings. Processes and device structures that are well known in the art are omitted here in order to make the technical solutions of the present invention clearer.

The First Embodiment

Figure 1:
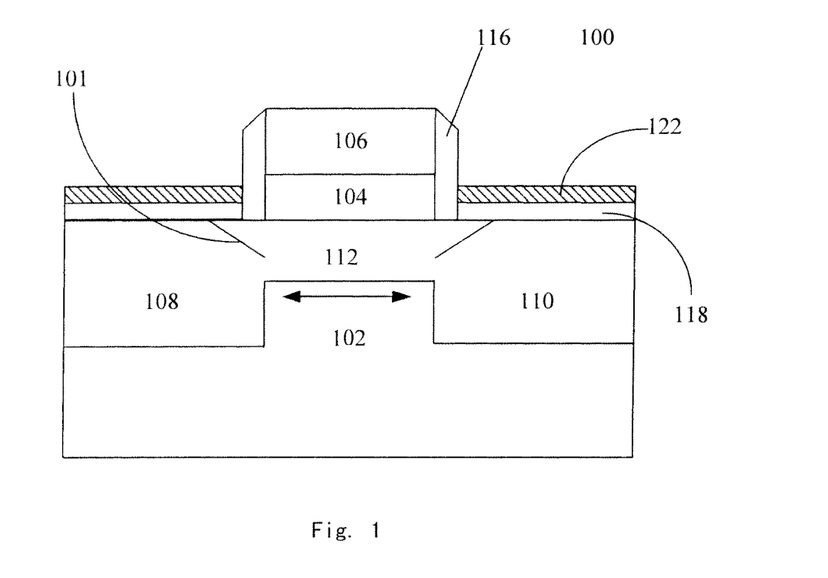
FIG. 1 schematically illustrates a transistor according to a first embodiment of the present invention.

FIG. 1 schematically illustrates a transistor according to the first embodiment of the present invention. As shown in FIG. 1, a transistor 100 comprises a semiconductor substrate 102, a gate dielectric layer 104 formed on the semiconductor substrate 102, a gate 106 formed on the gate dielectric layer 104, a source region 108 and a drain region 110 in the semiconductor substrate 102 and on respective sides of the gate 106, and a channel region 112 that is under the gate dielectric layer 104 and between the source region 108 and the drain region 110. In the transistor 100 shown in FIG. 1, each of the source region 108 and the drain region 110 comprises a dislocation 101 adjacent to the channel region 112. The dislocation 101 applies tensile stress (as indicated by the arrow in the figure) to the channel region 112, which increases the electron mobility in the channel region.

The transistor 100 further comprises sidewall spacers formed on the side surfaces of the gate dielectric layer 104 and the gate 106, a semiconductor layer 118 formed on the source region 108 and the drain region 110, and a metal silicide layer 122 formed on the semiconductor layer. The semiconductor layer 118 may be a layer of Si, SiGe or Si:C. Actually, the transistor 100 further comprises source and drain contacts, which are well known in the art and are thus neither shown in the drawings nor described in detail.

The method for forming the transistor 100 comprises forming dislocations in the source region 108 and the drain region 110 as shown in FIG. 11a-c, then forming the sidewall spacer 116 on the side surfaces of the gate dielectric layer 104 and the gate 106, and subsequently forming the semiconductor layer 118 on the source region 108 and the drain region 110, resulting in the structure shown in FIG. 2a. The semiconductor layer 118 may be formed by way of epitaxial growth, for example, sputtering, CVD (Chemical Vapor Deposition), PVD (Physical Vapor Deposition), Atomic Layer Deposition (ALD) and/or other suitable processes. The semiconductor layer 118 may be typically doped. Next, a metal layer 120, for example, a layer of Ni, Ti or Co, is deposited on the semiconductor layer 118, as shown in FIG. 2b. Finally, the structure obtained in FIG. 2b is annealed so that the metal in the metal layer 120 reacts with the semiconductor layer 118 to form the metal silicide layer 122, and the unreacted portion of the meal layer 120 is removed, resulting in the transistor shown in FIG. 1.

According to the present embodiment, the bottom of the metal silicide is above the channel, and therefore contact resistance of the source and drain contacts is reduced while the tensile stress caused by the dislocations formed in the source region and the drain region is prevented from significantly decreasing.

The Second Embodiment

Figure 3:
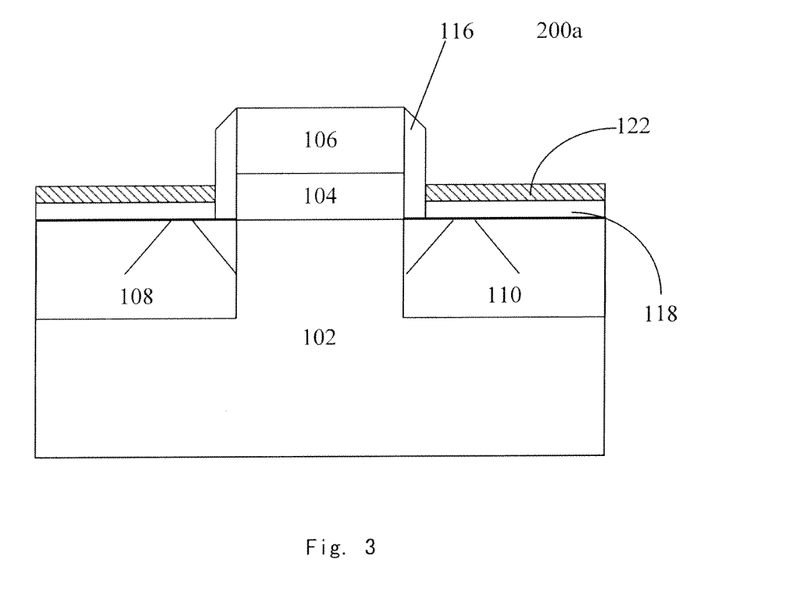
FIG. 3 schematically illustrates an exemplary transistor according to a second embodiment of the present invention.

FIG. 3 schematically shows an exemplary transistor 200a according to the second embodiment of the present invention. The transistor 200a shown in FIG. 3 is different from the transistor 100 in the first embodiment in that there are two dislocations in each of the source region 108 and the drain region 110. Although the dislocations are shown not to intersect each other in FIG. 3, the dislocations may intersect each other.

Figure 4A:
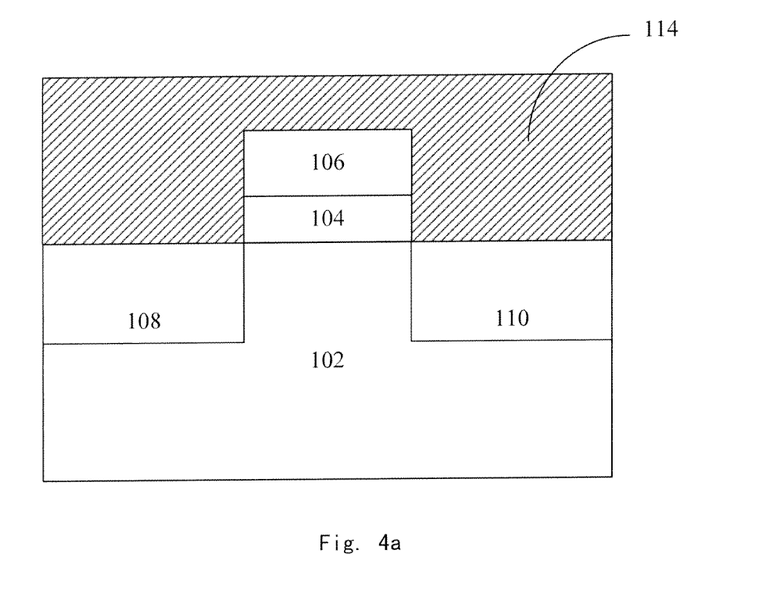
FIGS. 4a-4d schematically illustrate some of the steps for forming the transistor shown in FIG. 3.

FIG. 4a-d show some phases during the manufacture of the transistor 200a. As shown in FIG. 4a, a mask layer 114 is formed on a semiconductor substrate 102 on which a gate dielectric layer 104 and a gate 106 have been formed. The mask layer 114 may be formed from photoresist, or may be a hard mask layer formed of a dielectric material such as silicon oxide and/or silicon nitride. Although the mask layer 114 is shown to be formed to cover the gate 106 in FIG. 1, the present invention is not limited thereto. The mask layer 114 may be formed to be flushed with or lower than the gate 106.

Figure 4B:
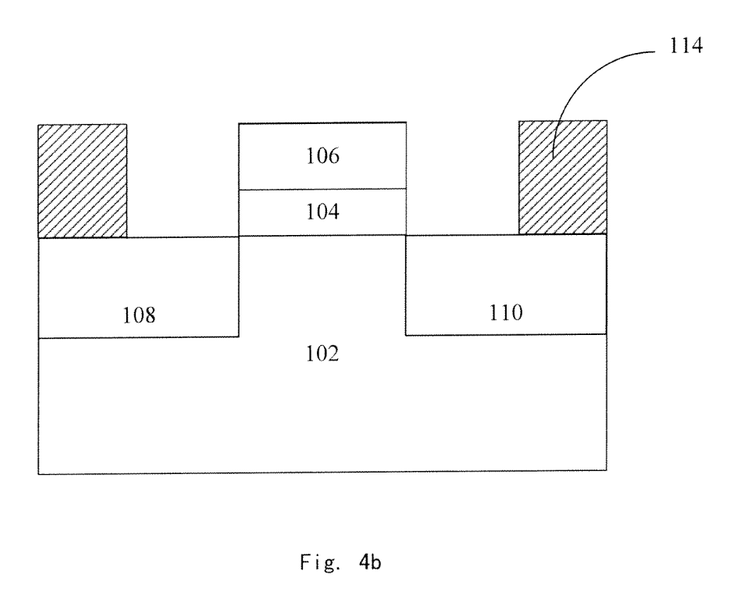

Next, as shown in FIG. 4b, the mask layer 114 is patterned so that a portion of each of the source region 108 and the drain region 110 is exposed. The patterning of the mask layer 114 may be achieved by photolithography process that is well known in the art and will not be described in detail here.

Figure 4C:
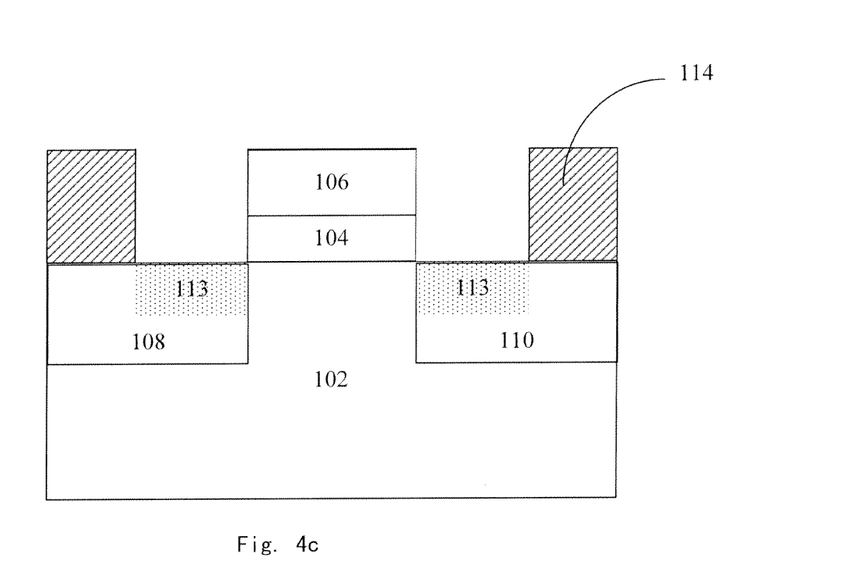

After patterning the mask layer 114, an ion implantation is performed to the exposed portions of the source region 108 and the drain region 110 so that amorphous regions 113 are formed as shown in FIG. 4c.

Figure 4D:
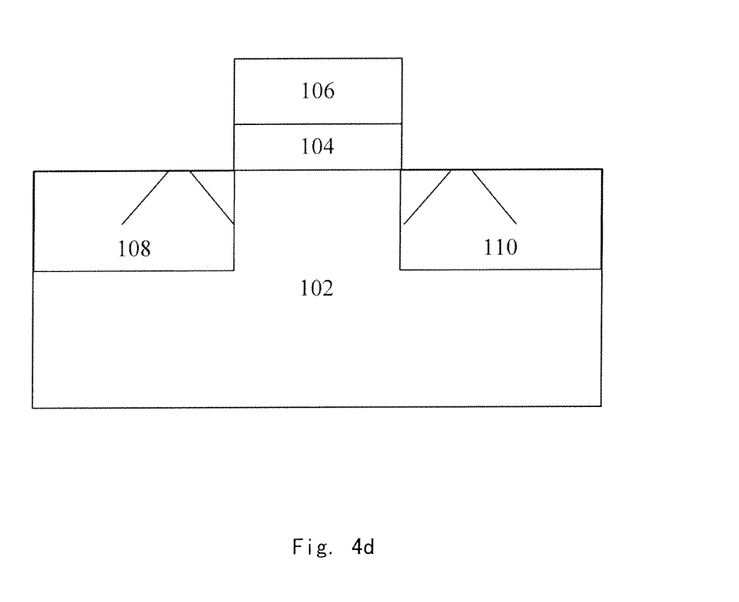

Subsequently, the mask layer 114 is removed and the structure thus obtained is annealed, thereby two dislocations are formed in each of the source region 108 and the drain region 110, as shown in FIG. 4d. In the case that the mask layer 114 is a hard mask layer, the mask layer 114 may be removed after the annealing.

Figure 2A:
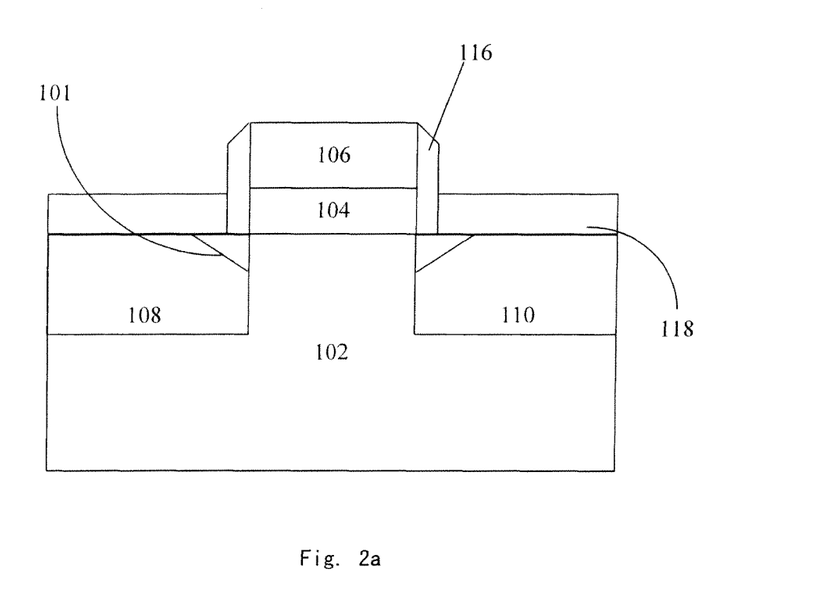
FIGS. 2a-2b schematically illustrate some of the steps for forming the transistor shown in FIG. 1.
Figure 2B:
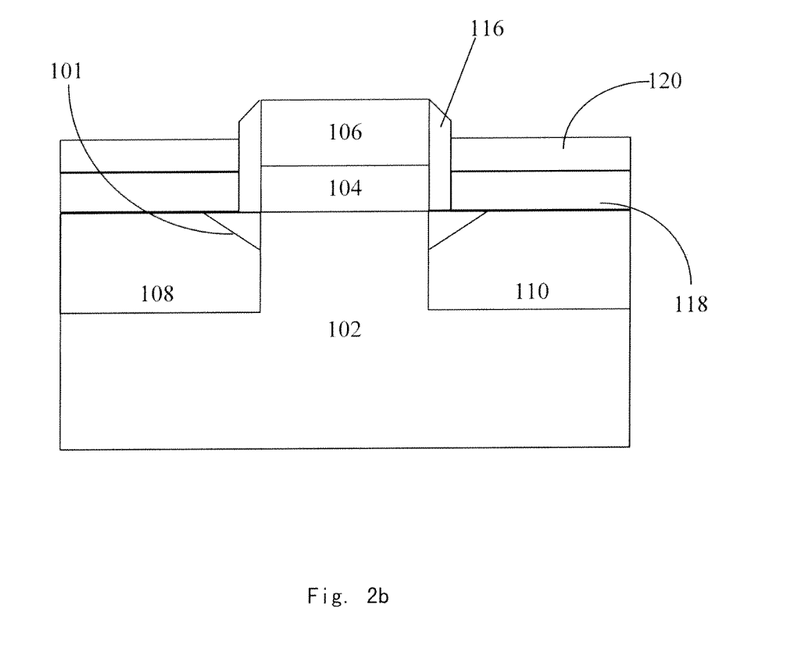

Finally, the sidewall spacer 106 is formed on the side surfaces of the gate dielectric layer 104 and the gate 106, and the same steps as those shown in FIGS. 2a and 2b are performed after forming the sidewall spacer 116 so as to form a semiconductor layer 118 and a metal silicide layer 122 on the source region 108 and the drain region 110. As a result, the transistor 300a shown in FIG. 3 is obtained.

Figure 5:
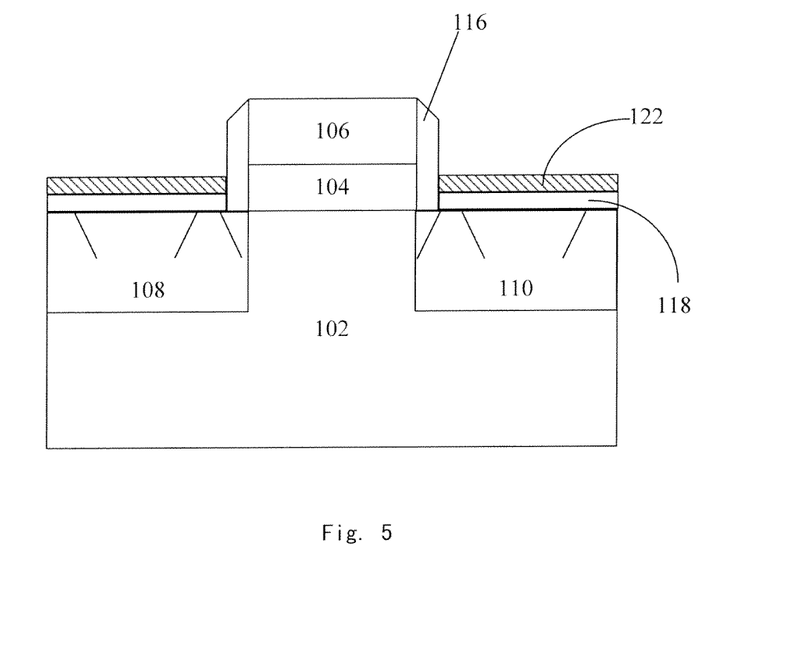
FIG. 5 schematically illustrate another exemplary transistor according to the second embodiment of the present invention.
Figure 6:
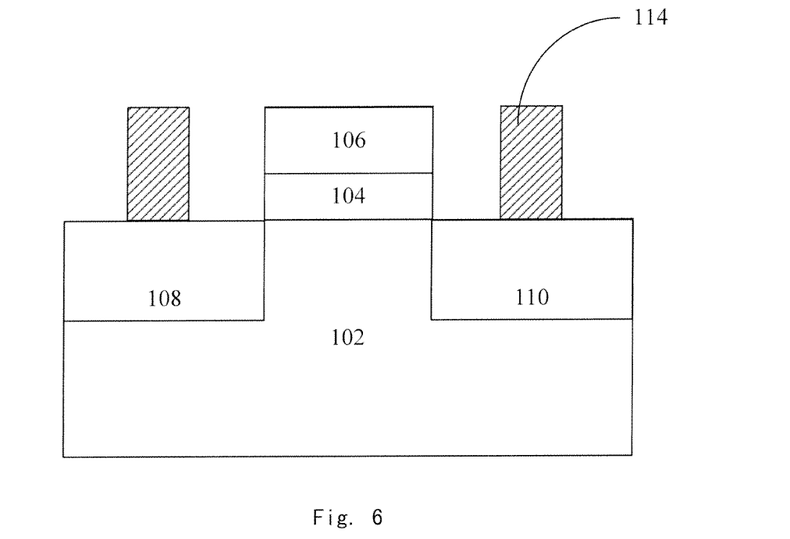
FIG. 6 schematically illustrates one of the steps for forming the transistor shown in FIG. 5.

FIG. 5 shows another exemplary transistor 200b according to the present embodiment, in which the source region 108 and the drain region 110 each comprises three dislocations. Accordingly, the method for forming the transistor 200b is different from that for forming the transistor 200a only in the step shown in FIG. 4b. In the method for forming the transistor 200b as shown in FIG. 4b, the mask layer 114 is patterned so that two portions of each of the source region 108 and the drain region 110 are exposed with the mask layer between the two exposed portions being not removed. FIG. 6 schematically shows a step in the manufacture of the transistor 200b that is corresponding to the step shown in FIG. 4b. From the above, it will be appreciated by those skilled in the art that more dislocations may be formed in the source region and the drain region by patterning the mask layer 114 so that more portions of the source region 108 and the drain region 110 are exposed (the mask layer 114 is not removed between the adjacent exposed portions).

Although the dislocations in the source region 108 and those in the drain region 110 are described to be symmetrical to each other hereinabove, the present invention is not limited thereto. In a variation of the present embodiment, dislocations may be formed asymmetrically in the source region 108 and the drain region 110 by patterning the mask layer 114 on the source region 108 and the mask layer 114 on the drain region 110 with different patterns. In addition, it is preferable to only expose at least a portion of the source region 108 while keeping the drain region 110 covered by the mask layer 114 so that the dislocation is only formed in the source region 108, thereby avoiding the increase of junction leakage.

In addition to the same advantages as those of the first embodiment, the present embodiment also has an advantage that more dislocations are formed parallel to the top surface of the substrate and the tensile stress applied to the channel region is increased, which makes it possible for the electron mobility in the channel region to be further increased.

The Third Embodiment

Figure 7:
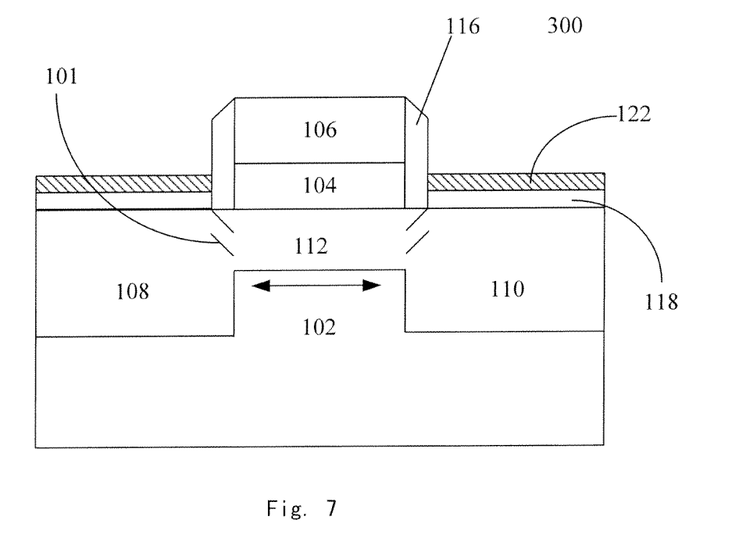
FIG. 7 schematically illustrates a transistor according to a third embodiment of the present invention.

FIG. 7 schematically illustrates a transistor according to a third embodiment of the present invention. The transistor 300 of FIG. 7 is different from the transistor 100 of FIG. 1 in that the source region 108 and the drain region 110 comprise a set of two dislocations that are adjacent to the channel region 112 and arranged in the direction perpendicular to the top surface of the semiconductor substrate 102.

Figure 8A:
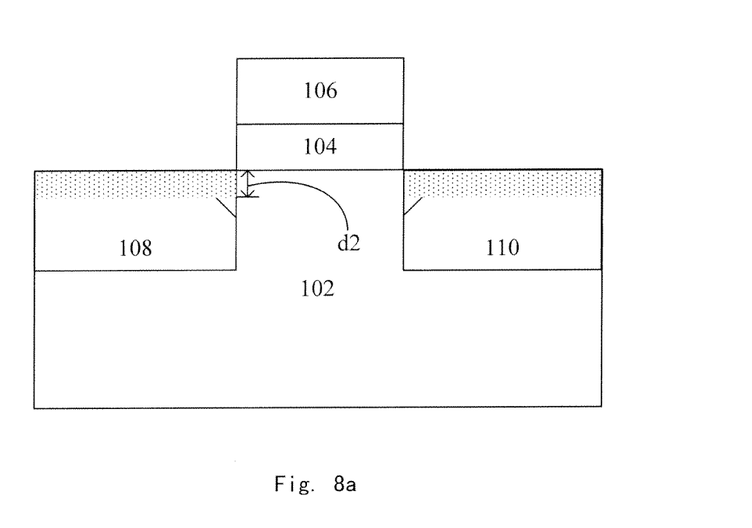
FIG. 8a-8b schematically illustrate some of the steps for forming the transistor shown in FIG. 7.
Figure 8B:
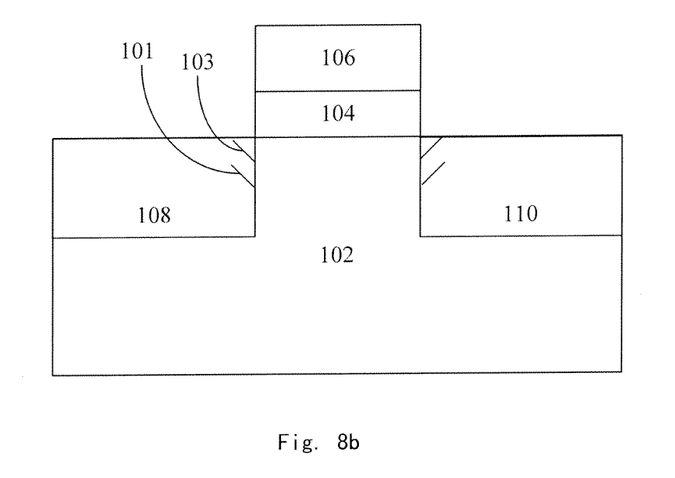

Accordingly, as compared with the method for forming the transistor 100 in the first embodiment, the method for forming the transistor 300 in accordance with the present embodiment further comprises performing a second ion implantation to the source region 108 and the drain region 110 so as to form amorphous regions after the annealing step of the method in the first embodiment. The implantation depth d2 of the second ion implantation is smaller than the first implantation depth d1 in the first embodiment, as shown in FIG. 8a. An annealing is performed after the second ion implantation so that additional dislocations 103 are formed in the source region 108 and the drain region 110, as shown in FIG. 8b. The ion implantation depth may be controlled by adjusting the energy and dose of the ion implantation. Afterwards, the sidewall spacer 116 may be formed on the side surfaces of the dielectric layer 104 and the gate 106. After forming the sidewall spacer 116, the same steps as those shown in FIGS. 2a and 2b are performed so that the semiconductor layer 118 and the metal silicide layer 122 are formed on the source region 108 and the drain region 110. As a result, the transistor 300 shown in FIG. 7 is obtained.

Although FIG. 7 shows that each of the source region 108 and the drain region 110 comprises a set of two dislocations, the present invention is not limited thereto. Each of the source region 108 and the drain region 110 may comprise a set of more than two dislocations that are adjacent to the channel region 112 and arranged in the direction perpendicular to the top surface of the semiconductor substrate 102. Accordingly, the more dislocations are formed by performing more ion implantations with different implantation depths, in which case the implantation depth of a later ion implantation is smaller than that of a former one.

In addition to the same advantages as those of the first embodiment, the present embodiment also has an advantage that more dislocations may be formed adjacent to the channel region as required and the tensile stress applied to the channel region is further increased, which accordingly makes it possible for the electron mobility in the channel region to be further increased.

The Fourth Embodiment

The fourth embodiment is a combination of the second embodiment and the third embodiment. The method for forming a transistor according to the present embodiment may selectively form a mask layer 114 on at least one of the drain region 110 and the source region 108 so as to expose a portion or at least two portions thereof. In the case that at least two portions of at least one of the source region 108 and the drain region 110 are exposed, part of the source region 108 and/or the drain region 110 that is between adjacent exposed portions is covered by the mask layer 114. In one preferred embodiment, at least the portion of the source region 108 and/or the drain region 110 that is adjacent to the gate 106 is exposed. The selective formation of the mask layer may be achieved by the photolithography process that is well known in the art.

In the case that mask layers are selectively formed before more than one ion implantations, the patterns of the mask layers formed at one time may be the same or vary from one mask layer to another, and the pattern of the mask layer formed on the source region may be different form that of the mask layer formed on the drain region. In one preferred embodiment, the mask layer is formed of a dielectric material such as silicon oxide and/or silicon nitride, and thus there is no need to remove the mask layer during the process of annealing. As a result, by performing the step of selectively forming the mask layer only once, a plurality of dislocations may be formed in the direction perpendicular to the top surface of the substrate through multiple implantation-annealing procedures while a plurality of dislocations are formed in the direction parallel to the top surface of the substrate.

Figure 9A:
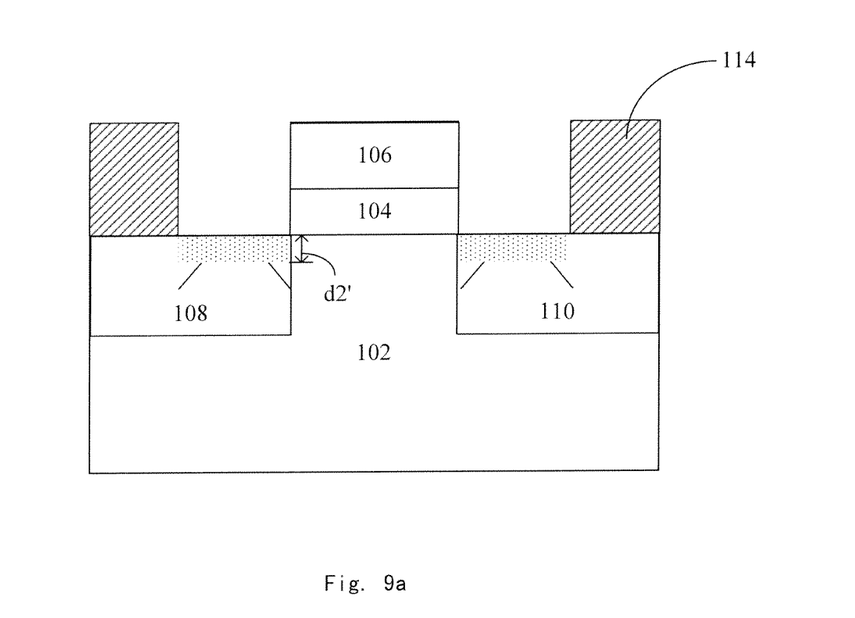
FIG. 9a schematically illustrates one of the steps of the method for forming a transistor according to an example of a fourth embodiment of the present invention.
Figure 9B:
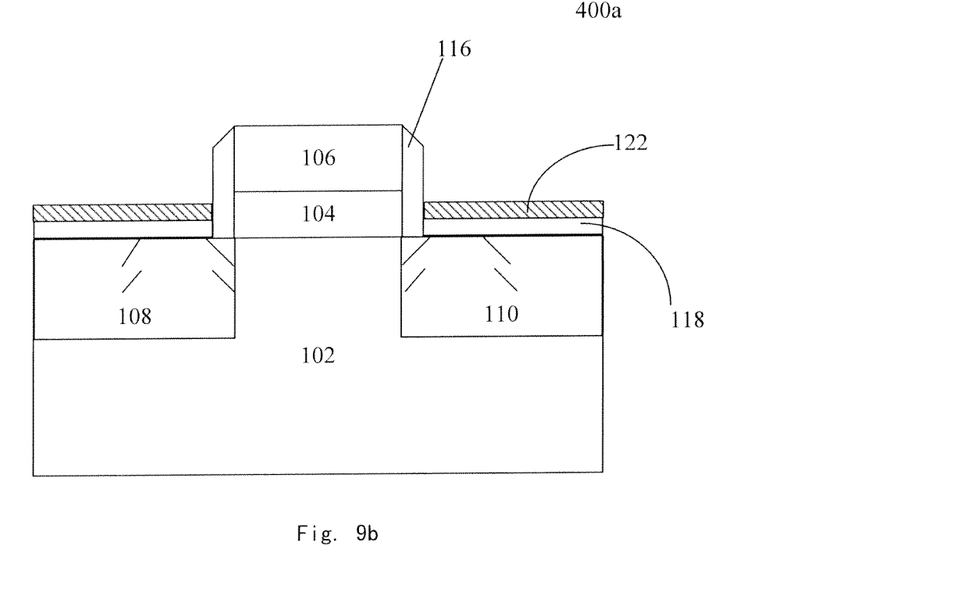
FIG. 9b schematically illustrates the transistor according to the example of the fourth embodiment of the present invention.

In a non-limiting example, a second ion implantation with an implantation depth of d2' smaller than the first implantation depth d1 in the first embodiment is performed after forming the structure shown in FIG. 4d in the second embodiment, and a structure shown in FIG. 9a is obtained. The mask layer 114 is removed after the second ion implantation and an annealing is performed to form dislocations. Afterwards, the sidewall spacer 116 may be formed on the side surfaces of the dielectric layer 104 and the gate 106. After forming the sidewall spacer 116, the same steps as those shown in FIGS. 2a and 2b are performed so that the semiconductor layer 118 and the metal silicide layer 122 are formed on the source region 108 and the drain region 110. As a result, the transistor 400a shown in FIG. 9b is obtained. It is preferable to use a hard mask layer as the mask layer 114 in this example, so that there is no need to remove the mask layer 114 during the annealing performed for forming the device structure shown in FIG. 4d, and the mask layer 114 still remains when the second ion implantation is performed.

Figure 10A:
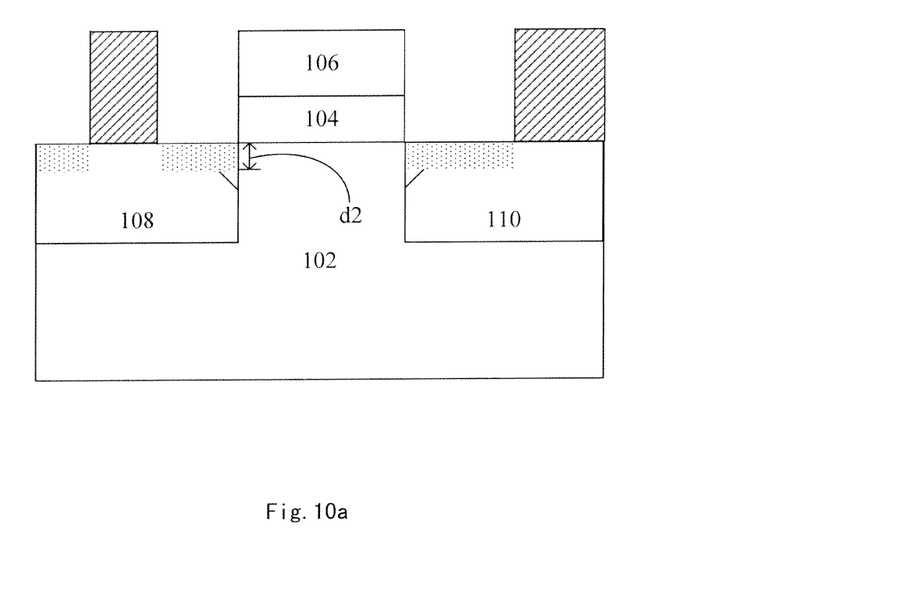
FIG. 10a schematically illustrates one of the steps of the method for forming a transistor according to another example of the fourth embodiment of the present invention.
Figure 10B:
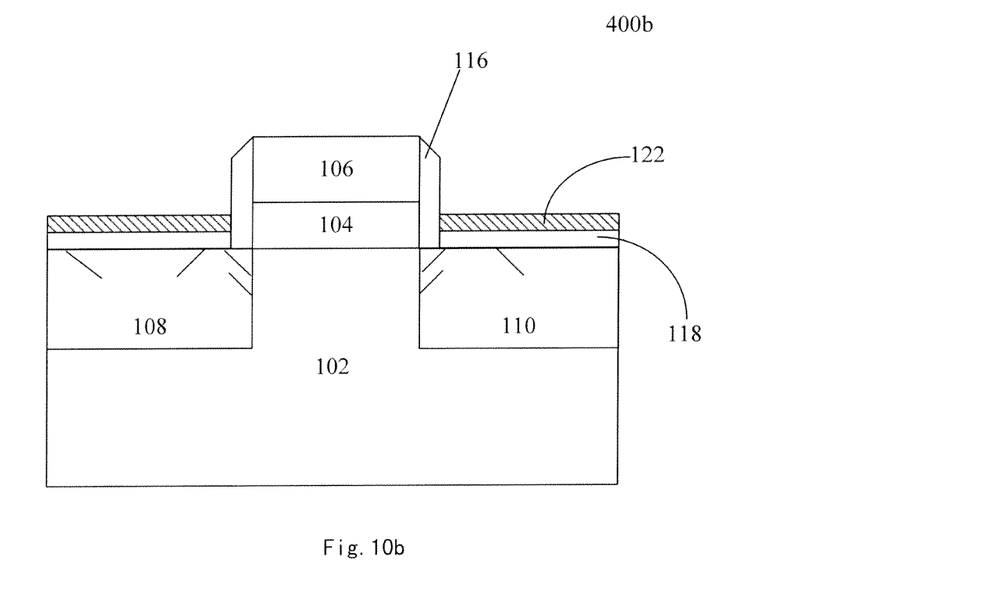
FIG. 10b schematically illustrates the transistor according to another example of the fourth embodiment of the present invention.

In another non-limiting example, in addition to the steps of the third embodiment, the mask layer 114 is selectively formed before the second ion implantation so that two portions of the source region 108 are exposed with part of the source region 108 that is between adjacent exposed portions of the source region 108 being covered by the mask layer 114, while only one portion of the drain region 110 is exposed. FIG. 10a shows the structure obtained after the second ion implantation subsequent to the formation of the mask layer 114. Then the mask layer 114 is removed and the structure thus obtained is annealed. The mask layer 114 may be removed before or after the annealing as required. Afterwards, the sidewall spacer 116 may be formed on the side surfaces of the dielectric layer 104 and the gate 106. After forming the sidewall spacer 116, the same steps as those shown in FIGS. 2a and 2b are performed so that the semiconductor layer 118 and the metal silicide layer 122 are formed on the source region 108 and the drain region 110. As a result, the transistor 400b shown in FIG. 10b is obtained.

Therefore, the transistor of the present embodiment comprises at least a further dislocation in the source region and/or the drain region that is farther from the channel region than the dislocations formed in the third embodiment.

The direction that is parallel to the top surface of the substrate is defined as the horizontal direction of the transistor, and the direction that is perpendicular to the top surface of the substrate is defined as the vertical direction of the transistor. As compared with the first, second and third embodiments, more dislocations in both of the horizontal and the vertical directions of the transistor are obtained in the fourth embodiment. Thus, in addition to the same advantages as those of the first embodiment, the fourth embodiment makes it possible for the tensile stress applied to the channel region (and thus the electron mobility of the channel region) to be further increased.

In addition, it is preferable that the mask layer 114 completely covers the drain region 110 before each ion implantation in this embodiment so that no dislocation is formed in the drain region 110 and the increase of junction leakage is prevented.

The transistors in accordance with the first to fourth embodiments may be NMOS transistors.

In the methods for forming the transistors in accordance with the first to fourth embodiments, the semiconductor substrate may comprise an NMOS device region and a PMOS device region, and the methods for forming the transistors in accordance with the present invention are performed only in the NMOS device region.

In the first to fourth embodiments, the transistors may also comprise a semiconductor layer (not shown), for example, a layer of Si, SiC, SiGe or Ge, on the source region 108, which makes the dislocations not to be exposed to a free surface. The fact that the semiconductor layer makes the dislocations not to be exposed to a free surface prevents the decrease of the tensile stress which may arise in the case that dislocations are exposed to a free surface.

In the first to fourth embodiments, the ions implanted in the ion implantations may be one of Si, Ge, P, B and As, or any combination thereof.

In the first to fourth embodiments, the annealing temperature may be greater than 400° C., preferably 500° C.-900° C., and the annealing time may be in the range of several seconds to several minutes.

The formation of the sidewall spacer and the source/drain contact and so on that are well known in the art may be performed after the steps in the method described in the first to fourth embodiments so as to form a complete device.

Although in the above descriptions, the doping processes for forming the source and the drain are performed after the formation of the dislocations, the present invention is not limited thereto. The dislocations may be formed in any suitable phase. For example, the dislocations may be formed after the doping of the source and the drain.

Furthermore, the semiconductor substrate mentioned above may be a silicon substrate, a SiGe substrate, a SiC substrate or a III-V semiconductor (for example, GaAs, GaN, etc.) substrate. The gate dielectric layer may use one of $SiO_2$, $HfO_2$, HfSiO, HfSiON, HfTaO, HfSiO, HfZrO, $Al_2O_3$, $La_2O_3$, $ZrO_2$ and LaAlO or any combination thereof, and the material of the gate may be selected from a group comprising Poly-Si, Ti, Co, Ni, Al, W, the alloy thereof and the silicide thereof.

The transistor and the method for forming the same according to the present invention are described by way of exemplary embodiments hereinbefore. However, the scope of the present invention does not intend to be limited thereto. Any modifications or variations of the above embodiments that may be contemplated by one skilled in the art will fall within the scope of the present invention defined by the appended claims.

What is claimed is:

1. A transistor comprising:
   a semiconductor substrate;
   a gate dielectric layer formed on the semiconductor substrate;
   a gate formed on the gate dielectric layer;
   a source region and a drain region located in the semiconductor substrate and on respective sides of the gate, wherein at least one of the source region and the drain region comprises at least one dislocation;
   an epitaxial semiconductor layer containing silicon located on the source region and the drain region; and
   a metal silicide layer on the epitaxial semiconductor layer, wherein at least one of the source region and the drain region comprises a first set of dislocations that are adjacent to the channel region and arranged in the direction perpendicular to the top surface of the semiconductor substrate, and the first set of dislocations comprises at least two dislocations.

2. The transistor according to claim 1, wherein at least one of the source region and the drain region comprises at least one further dislocation that is farther away from the channel region than the first set of dislocations.

3. The transistor according to claim 1, wherein at least one of the source region and the drain region comprises at least a further set of dislocations that are arranged in the direction perpendicular to the top surface of the semiconductor substrate and farther away from the channel region than the first set of dislocations, and the at least further set of dislocations comprises at least two dislocations.

4. The transistor according to claim 1, wherein at least one of the source region and the drain region comprises a plurality of dislocations arranged in the direction parallel to the top surface of the semiconductor substrate.

5. The transistor according to claim 1, wherein the dislocation applies tensile stress to the channel region between the source region and the drain region so that the electron mobility of the channel region is increased.

6. The transistor according to claim 1, wherein the transistor is an NMOS transistor.

7. The transistor according to claim 1, wherein there is no dislocation in the drain region.

* * * * *